United States Patent
Hayashi

(10) Patent No.: US 9,035,438 B2
(45) Date of Patent: May 19, 2015

(54) SEMICONDUCTOR DEVICE AND METHOD FOR MANUFACTURING SAME

(71) Applicant: Shoji Hayashi, Nagoya (JP)

(72) Inventor: Shoji Hayashi, Nagoya (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 14/159,513

(22) Filed: Jan. 21, 2014

(65) Prior Publication Data
US 2014/0203423 A1 Jul. 24, 2014

(30) Foreign Application Priority Data
Jan. 21, 2013 (JP) ................. 2013-008114

(51) Int. Cl.
| H01L 23/495 | (2006.01) |
| H01L 23/10 | (2006.01) |
| H01L 23/34 | (2006.01) |
| H01L 21/56 | (2006.01) |
| H01L 23/28 | (2006.01) |
| H01L 23/433 | (2006.01) |

(52) U.S. Cl.
CPC .............. *H01L 23/34* (2013.01); *H01L 21/56* (2013.01); *H01L 23/28* (2013.01); *H01L 2224/48091* (2013.01); *H01L 2224/49175* (2013.01); *H01L 23/4334* (2013.01); *H01L 23/49513* (2013.01); *H01L 23/4952* (2013.01); *H01L 23/49562* (2013.01); *H01L 23/49568* (2013.01)

(58) Field of Classification Search
USPC .................. 257/666, 675, 706, 712, E23.031; 438/123
See application file for complete search history.

(56) References Cited

U.S. PATENT DOCUMENTS

| 5,485,037 | A | * | 1/1996 | Marrs | 257/712 |
| 6,040,626 | A | * | 3/2000 | Cheah et al. | 257/735 |
| 6,229,702 | B1 | * | 5/2001 | Tao et al. | 361/704 |
| 6,307,755 | B1 | * | 10/2001 | Williams et al. | 361/813 |
| 6,992,395 | B2 | * | 1/2006 | Fukasawa | 257/777 |
| 7,598,603 | B2 | * | 10/2009 | Otremba | 257/675 |
| 7,622,796 | B2 | * | 11/2009 | Shi et al. | 257/678 |

(Continued)

FOREIGN PATENT DOCUMENTS

| JP | H11-26688 A | 1/1999 |
| JP | 2002-314030 A | 10/2002 |

(Continued)

*Primary Examiner* — Nitin Parekh
(74) *Attorney, Agent, or Firm* — Gifford, Krass, Sprinkle, Anderson & Citkowski, P.C.

(57) ABSTRACT

The present specification relates to a semiconductor device in which a metal plate is attached onto a surface of a resin package, and provides a structure in which the metal plate is not easy to separate. The semiconductor device disclosed in the present specification includes semiconductor chips (IGBT, diode), a resin package molding the semiconductor chips, and metal plates fixed onto the surface of the resin package. An anchoring member is bridged between two points on a back face of the metal plate. A space between one of the metal plates and the anchoring member is filled with a molding resin of the resin package. The anchoring member firmly bites the resin package, and therefore, the metal plate is difficult to be released from the resin package.

8 Claims, 7 Drawing Sheets

(56) References Cited

U.S. PATENT DOCUMENTS

| | | | |
|---|---|---|---|
| 7,884,469 B2 * | 2/2011 | Shi et al. | 257/720 |
| 8,354,740 B2 * | 1/2013 | Liu et al. | 257/675 |
| 8,513,784 B2 * | 8/2013 | Lu et al. | 257/666 |
| 2002/0149094 A1 | 10/2002 | Sakabe | |
| 2004/0108602 A1 | 6/2004 | Nakajima et al. | |
| 2008/0246130 A1 * | 10/2008 | Carney et al. | 257/675 |
| 2009/0236708 A1 * | 9/2009 | Shi et al. | 257/675 |
| 2013/0099364 A1 * | 4/2013 | Liu et al. | 257/675 |

FOREIGN PATENT DOCUMENTS

| | | |
|---|---|---|
| JP | 2003-124406 A | 4/2003 |
| JP | 2004-186622 A | 7/2004 |
| JP | 2005-183417 A | 7/2005 |
| WO | 2013046400 A1 | 4/2013 |

* cited by examiner

SEMICONDUCTOR DEVICE AND METHOD FOR MANUFACTURING SAME

INCORPORATION BY REFERENCE

The present application claims priority to Japanese Patent Application No. 2013-008114, filed on Jan. 21, 2013, the contents of which are hereby incorporated by reference into the present application.

TECHNICAL FIELD

The present invention relates to a semiconductor device in which a semiconductor chip is molded with resin and a method for manufacturing the same.

DESCRIPTION OF RELATED ART

There is known a semiconductor device in which a semiconductor chip is molded with resin. In the present specification, a body of resin molding the semiconductor chip is referred to as a resin package. Such a semiconductor device is typically adopted in an inverter driving a motor of an electric vehicle. In such an inverter, an operating electric power is large, and a heating value of the semiconductor chip is large. Consequently, a radiator plate may be attached to the resin package molding the semiconductor chip. The radiator plate is brought into contact with the semiconductor chip within the resin package, and heat of the semiconductor chip is transferred to a surface of the resin package. A part of an electrode in contact with the semiconductor chip may be utilized as the radiator plate.

A metal plate may be adopted for the radiator plate. On the other hand, the resin package may be mixed with a metal small piece which is referred to as filler. A bonding power is not strong between the resin package mixed with the filler and the metal plate. Because the filler on a surface of the resin is not brought into close contact with a metal. Moreover, thermal expansion rates of the metal and the resin are different from each other, and therefore, there is a concern of separation of the radiator plate from the resin package owing to a heat cycle of the semiconductor chip. A technology for restraining the separation of the radiator plate is disclosed in, for example, Japanese Patent Application Laid-open No. 2003-124406. According to the technology, a layer of polyamide resin is provided between the radiator plate and the resin package. The polyamide resin well conforms to the resin package and also the well conforms to the metal plate. The polyamide resin functions as an adhesive, and the separation of the radiator plate from the resin package is restrained. Japanese Patent Application Laid-open No. 2003-124406 also discloses that a ring-like member is fixed to the radiator plate to surround the semiconductor chip such that a film of the polyamide resin is not excessively thick at surroundings of the semiconductor chip. The extraneous polyamide resin gathers to the ring-like member by a surface tension, and the polyamide resin is spread thinly and uniformly at the surroundings of the semiconductor chip.

BRIEF SUMMARY OF INVENTION

The present specification provides a technology of fixing a metal plate (radiator plate) to the resin package more strongly than in using the polyamide resin.

According to the technology disclosed in the present specification, an anchoring member is bridged between two points on a back surface of the metal plate (radiator plate), and the anchoring member is embedded in the resin package. A space between the anchoring member and the metal plate is filled with molding resin of the resin package. The anchoring member firmly bites the resin package, and therefore, the metal plate is restrained from being separated from the resin package. Incidentally, "the back surface of the metal plate" means a face of the metal plate on a side in contact with the resin package.

A further advantage of the semiconductor device disclosed in the present specification resides in that the anchoring member and a metal wire (bonding wire) connecting the semiconductor chip and a terminal within the resin package can be formed of the same metal material. That is, the anchoring member can be fixed to the metal plate by using a bonding machine connecting the semiconductor chip and the terminal by the metal wire. Consequently, the present specification provides a novel method of manufacturing the semiconductor device described above. The method is featured in that the anchoring member is fixed to the back surface of the metal plate by using a tool bonding the metal wire (bonding wire) connecting the semiconductor chip and the terminal.

Incidentally, as the material of the anchoring member, a material having a thermal expansion rate lower than a thermal expansion rate of the molding resin of the resin package may preferably be adopted. The bonding wire is typically made of the material having a thermal expansion rate lower than the thermal expansion rate of the molding resin.

Also, it is preferable that the two semiconductor chips are molded in the resin package, and at least a portion of the anchoring member is positioned between the two semiconductor chips. This is because the metal plate is easy to separate from the resin package between the two semiconductor chips.

An explanation will be given of details of the technology disclosed in the present specification and other improvements thereof in "DETAILED DESCRIPTION OF INVENTION" described below.

DETAILED DESCRIPTION OF INVENTION

Figure 1:
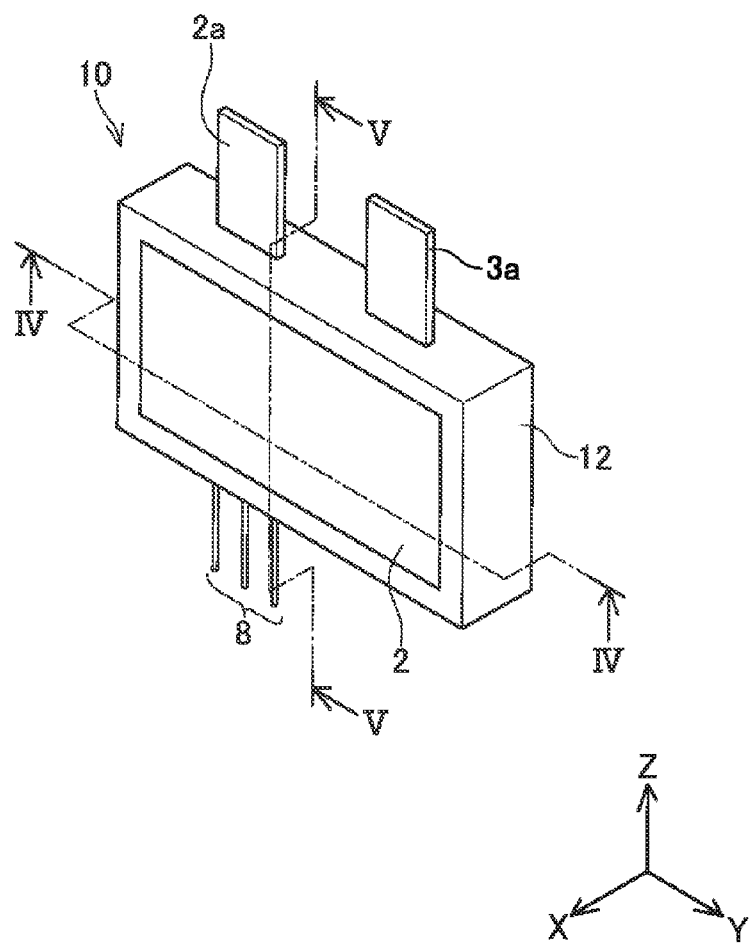
FIG. 1 is a perspective view of a semiconductor device according to an embodiment.

An explanation will be given of a semiconductor device 10 according to an embodiment in reference to the drawings. FIG. 1 shows a perspective view of the semiconductor device 10. The semiconductor device 10 is a device in which IGBT and a diode are molded with resin.

Figure 3:
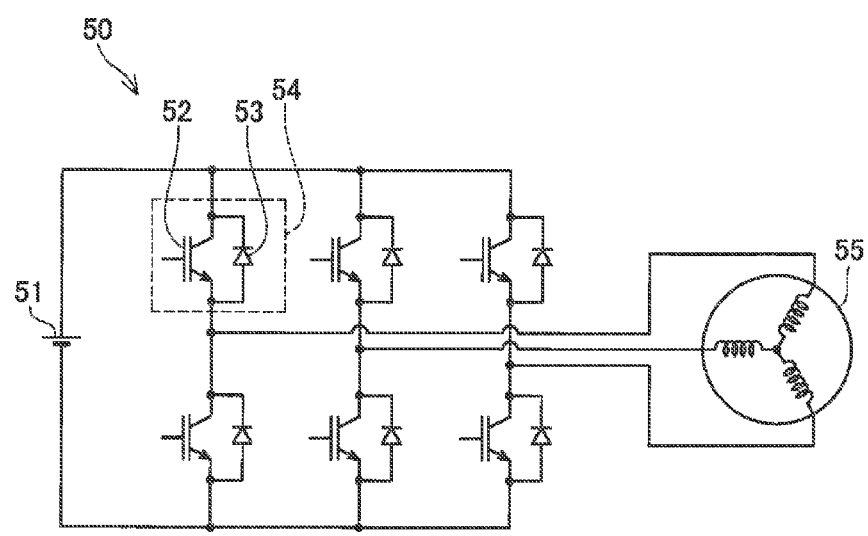
FIG. 3 is a circuit diagram of an inverter using the semiconductor device.

First, an explanation will be given of an application example of the semiconductor device 10. IGBT and the diode embedded in the semiconductor device 10 configure a switching circuit of an inverter. FIG. 3 shows the circuit diagram of an inverter 50 using the semiconductor device 10. The inverter 50 inverts electric power of a direct current power source 51 into an alternating current to supply to a motor 55. The inverter 50 includes 6 sets of switching circuits 54 configured by antiparallel circuits of IGBT's 52 and diodes 53. In the inverter 50, three sets of series connections of two pieces of the switching circuits 54 are connected in parallel. When a controller, not illustrated, supplies appropriate PWM signals to respective IGBT's, alternating currents are outputted from middle points of respective two pieces of the switching circuits 54. The alternating currents phases of which are shifted from each other by 120 degrees are outputted from respective three sets of the series connections of the respective two pieces of the switching circuits 54. The motor 55 is rotated by the three alternating currents. The single switching circuit 54 (antiparallel circuit of IGBT and diode) is embodied in the single semiconductor device 10.

Figure 2:
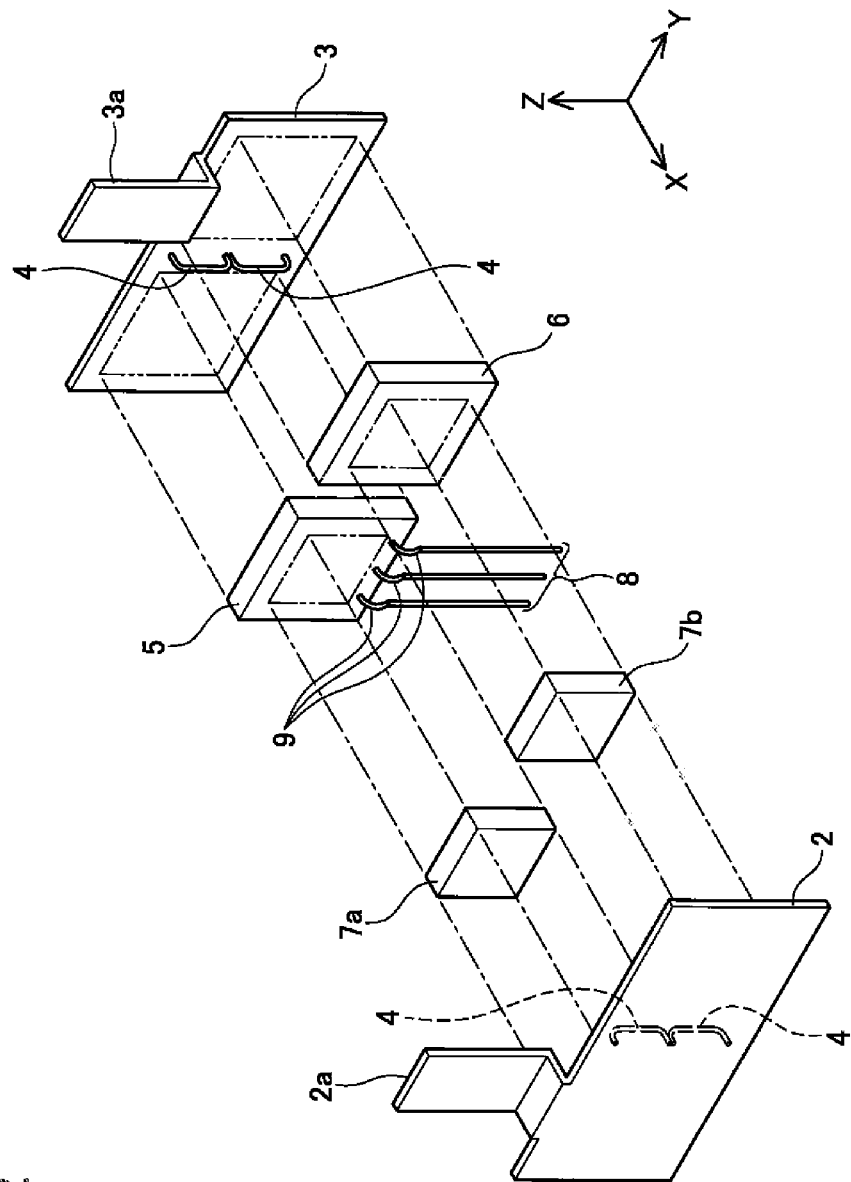
FIG. 2 is a disassembled perspective view of the semiconductor device (excluding a resin package)

The explanation will be back to a physical structure of the semiconductor device 10. A body of resin is referred to as a resin package 12. FIG. 2 shows the disassembled perspective view of the semiconductor device 10 excluding the resin package 12. In the semiconductor device 10, two pieces of semiconductor chips are molded with resin between two sheets of metal plates 2 and 3. Two pieces of the semiconductor chips are IGBT 5 and a diode 6 as described above. Two sheets of the metal plates 2 and 3 correspond to terminals of the antiparallel circuit of IGBT 5 and the diode 6, and at the same time, correspond to the radiator plates transferring heat of IGBT 5 and heat of the diode 6 to a surface of the resin package 12. As shown in FIG. 1, a face on one side of each of the metal plates 2 and 3 (front face) is exposed to a surface of the resin package 12. A terminal 2a is extended from an upper edge of the metal plate 2 and a terminal 3a is extended from an upper edge of the metal plate 3. The terminals 2a and 3a are extended from the resin package 12 to an upper side. The switching circuit is connected to an external circuit via the terminals 2a and 3a.

Figure 4:
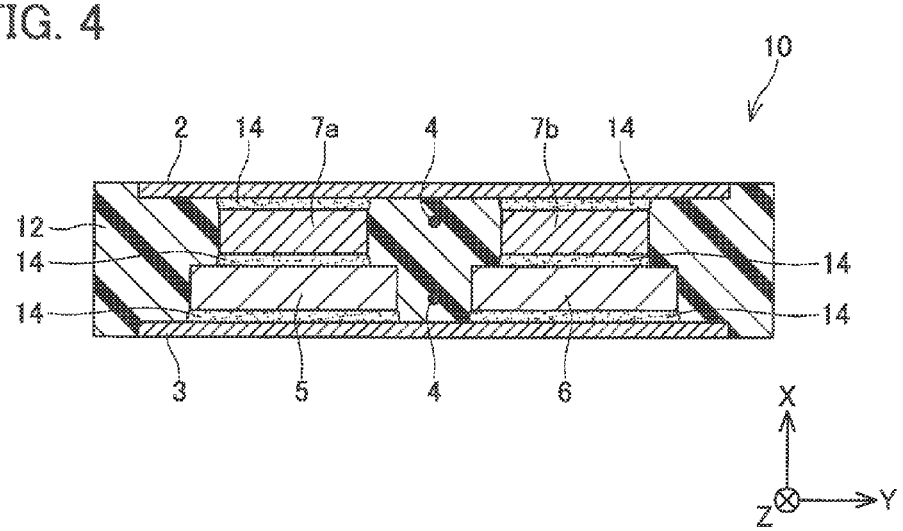
FIG. 4 is a sectional view taken along a line IV-IV of FIG. 1.
Figure 5:
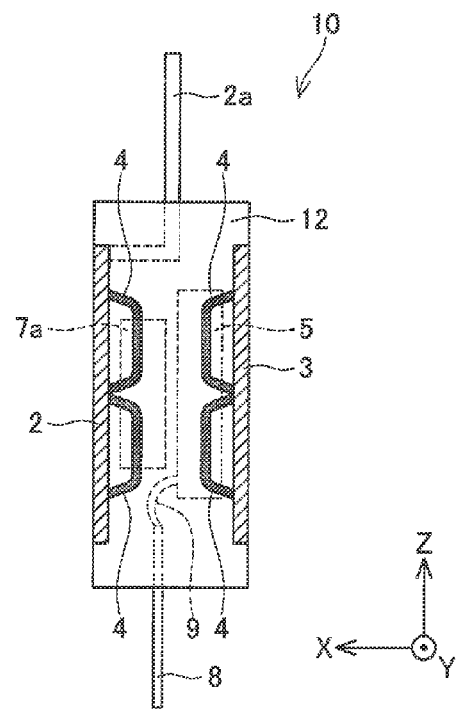
FIG. 5 is a sectional view taken along a line V-V of FIG. 1.

FIG. 4 shows the sectional view taken along the line IV-IV of FIG. 1, and FIG. 5 shows the sectional view taken along the line V-V of FIG. 1. A detailed explanation will be given of a structure on an inner side of the resin package 12 in reference to FIG. 1, FIG. 2, FIG. 4, and FIG. 5 as follows. Incidentally, please note that although a cross-section of the resin package 12 is shown in FIG. 5, hatchings to be inherently attached to the cross-section are omitted in order to assist understanding of the drawing.

Spacers 7a and 7b are fixed to other face (back surface) of the metal plate 2 by a soldering member 14. IGBT 5 is fixed to an opposite side of the spacer 7a (side opposed to metal plate 2) by the soldering member 14. The diode 6 is fixed to an opposite side of the spacer 7b by the soldering member 14. An opposite side of IGBT 5 and an opposite side of the diode 6 are fixed to a back face of the metal plate 3 by the soldering member 14. IGBT 5 is formed by a flat plate shape, and both faces thereof correspond to an emitter electrode and a collector electrode. The diode 6 is formed by a flat plate shape, and both faces thereof correspond to an anode electrode and a cathode electrode. Also the soldering member 14 has a conductivity, and also the spacers 7a and 7b have conductivity. Consequently, each of the electrodes (emitter electrode and collector electrode) of IGBT 5, and each of the electrodes (anode electrode and cathode electrode) of the diode 6 are conducted to the metal plate 2 or 3 via the soldering members 14. Consequently, the terminals 2a and 3a extended from the upper side of the resin package 12 correspond to the respective electrodes of the antiparallel circuit of IGBT 5 and the diode 6. Incidentally, copper having a small internal resistance and a high thermal expansion rate is suitable for the spacers 7a and 7b.

A gate of IGBT 5 is connected to a gate terminal 8 via a bonding wire 9. The gate terminal 8 is extended to a lower side of the resin package 12 (refer to FIG. 1). The bonding wire 9 is a metal wire having a diameter of 0.15 mm which is made of, for example, aluminum.

Anchoring members 4 are fixed to the back surface of the metal plates 2 and 3. Incidentally, "the back faces of the metal plates 2 and 3" means faces thereof opposed to the resin package 12. Two pieces of the anchoring members 4 are fixed to the back face of the metal plate 2. Two pieces of the anchoring members 4 are fixed also to the back face of the metal plate 3. The respective anchoring members 4 are the metal wires the same as the bonding wires 9. Both ends thereof are fixed to the metal plate 2 (metal plate 3). That is, the anchoring members 4 in a string-like wire shape is bridged between two points on the back face of the metal plate 2 (metal plate 3). Both ends of the anchoring member 4 are fixed to the metal plate 2 (metal plate 3), and a space is provided between the anchoring member 4 and the metal plate 2 (metal plate 3). In other words, the both ends of the anchoring member 4 are fixed to the metal plate 2 (metal plate 3) to thereby form a loop. When a molding resin is injected between two sheets of the metal plates 2 and 3, the space between the anchoring member 4 and the metal plate 2 (metal plate 3) is filled with the molding resin as described later. In other words, the anchoring member 4 is embedded to the resin package 12, and the metal plate 2 (metal plate 3) does not easily separate from the resin package 12.

The anchoring member 4 is made of a metal the same as that of the bonding wire 9, and a thermal expansion rate thereof is lower than a thermal expansion rate of the molding resin of the resin package 12. Consequently, the anchoring member 4 is not deformed by an amount which is so large as that of destructing the resin package 12.

The anchoring member 4 is positioned between two pieces of the semiconductor chips (IGBT 5 and the diode 6) as is well illustrated in FIG. 2 and FIG. 4. That is, the resin package 12 seals (molds) two pieces of the semiconductor chips, and at least a portion of the anchoring member 4 is arranged to pass between two pieces of the semiconductor chips. Both semiconductor chips undergo thermal deformation, and therefore, the metal plate 2 (metal plate 3) is easy to separate from the resin package 12 between two pieces of the semiconductor chips. The anchoring member 4 is positioned at a location where the metal plate 2 (metal plate 3) is easy to separate from the resin package 12 and restrains separation of the metal plate 2 (metal plate 3).

Figure 6:
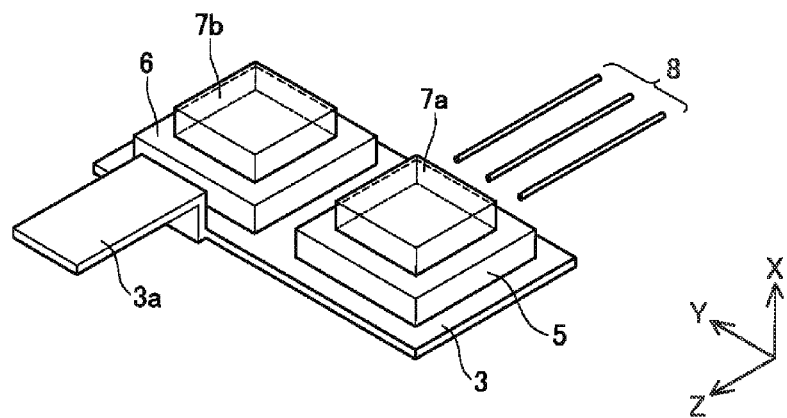
FIG. 6 is a view for explaining a method of manufacturing a semiconductor device (1)

Next, an explanation will be given of a method of manufacturing the semiconductor device 10 in reference to FIG. 6 through FIG. 10. First, IGBT 5 and the diode 6 are fixed onto the metal plate 2 on one side by the soldering member 14 (refer to FIG. 4, FIG. 5). The spacers 7a and 7b are fixed thereabove by the soldering member 14 (FIG. 6). Incidentally, the gate terminal 8 is arranged at a prescribed position by a jig, not illustrated.

Figure 7:
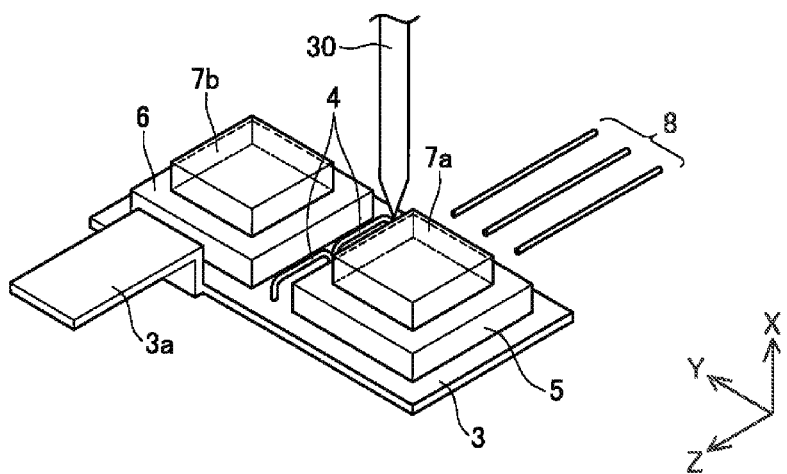
FIG. 7 is a view for explaining the method of manufacturing the semiconductor device (2)

Next, the anchoring member 4 is fixed to the back face of the metal plate 3 by a bonding tool 30 (FIG. 7). The anchoring member 4 is a string-like metal wire which is made of a material the same as that of the bonding wire 9 (described later). The bonding tool 30 fixes both ends of the string-like anchoring member 4 to the metal plate 3. Consequently, a space is formed between the anchoring member 4 and the metal plate 3 and between two fixed points. The space is later filled with the molding resin. In other words, the anchoring member 4 made of the wire forms a loop along with the back face of the metal plate 3.

The anchoring member 4 is fed by a wire feeder which configures a set along with the bonding tool 30, although not illustrated. The wire feeder is a device of feeding the bonding wire connecting the gate terminal 8 and a gate electrode of IGBT 5. It is confirmed that positioning of the bonding wire feeder and the bonding tool 30 is accurate by confirming that the anchoring member 4 is correctly fixed to the metal plate 3 between IGBT 5 and the diode 6. It is confirmed that the bonding wire 9 is correctly fixed to the slender gate terminal 8 at a successive step by the above confirmation. Incidentally, in a case where the anchoring member 4 is not correctly fixed to the metal plate 3, operation is temporarily stopped, and the wire feeder or the bonding tool 30 is adjusted. The bonding wire (anchoring member 4) is fixed to the back face of the metal plate 3 prior to connecting the bonding wire 9 to the gate terminal 8. This fixing operation corresponds to "trial operation" in order to confirm accuracy of positioning the bonding wire feeder and the bonding tool 30.

An explanation will be given of the "trial operation". In a process of manufacturing the semiconductor device, the bonding machine may be used on trial in order to test whether the metal wire can firmly be bonded to a target position before connecting the semiconductor chip and the terminal by the metal wire. The confirmation beforehand is referred to as "trial operation". A position of fixing the anchoring member may not be strictly accurate. Therefore, the metal wire can be used in the anchoring member by fixing the metal wire to the metal plate by the trial operation. When the anchoring member is fixed to a prescribed position, it is confirmed that the bonding machine is accurately operated. When it is confirmed that the bonding machine is normally operated, the terminal and the semiconductor chip can firmly be connected by the metal wire.

Figure 8:
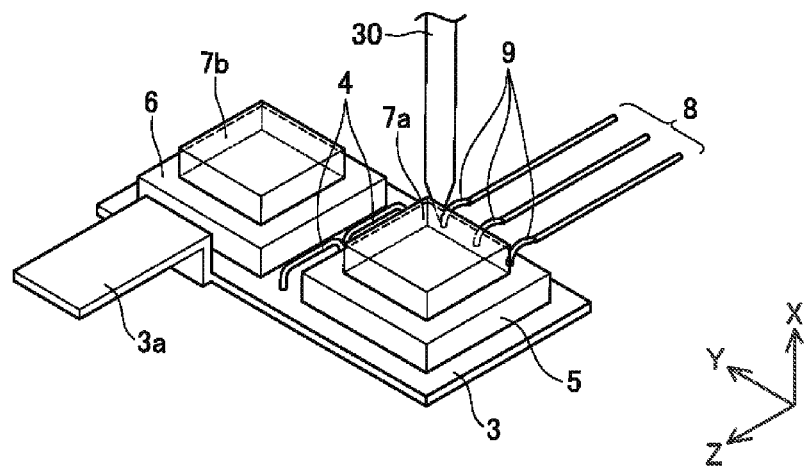
FIG. 8 is a view for explaining the method of manufacturing the semiconductor device (3)

The gate terminal 8 and the gate electrode of IGBT 5 are connected by using the wire feeder and the bonding tool 30 after fixing the anchoring member 4 (FIG. 8). The gate terminal 8 and IGBT 5 are connected specifically by the bonding wire 9 which is a metal wire the same as that of the anchoring member. It is confirmed that the bonding tool 30 and the wire feeder are accurately operated by the trial operation. Therefore, the bonding tool 30 and the wire feeder are accurately operated also at this occasion.

Figure 9:
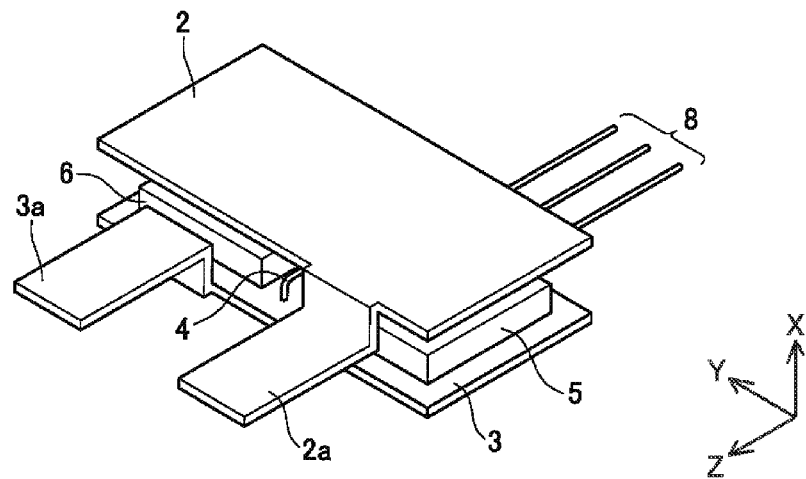
FIG. 9 is a view for explaining the method of manufacturing the semiconductor device (4)
Figure 10:
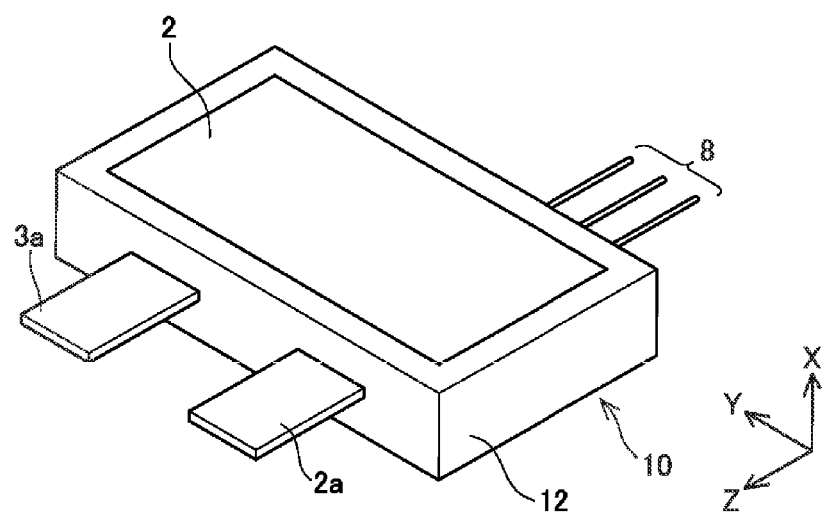
FIG. 10 is a view for explaining the method of manufacturing the semiconductor device (5).

Next, the metal plate 2 on the other side is fixed onto the spacers 7a and 7b by the soldering member (FIG. 9). Incidentally, the anchoring member 4 is previously fixed also onto the back face of the metal plate 2. Finally, an assembly of the metal plates 2 and 3, the semiconductor chips (IGBT 5, diode 6), and the spacers 7a and 7b is put into a mold, the molding resin is injected into the mold, and the resin package 12 is formed between the metal plates 2 and 3 (FIG. 10). Consequently, the semiconductor device 10 is finished. A resin mixed with a particle (filler) made of a metal is used for the molding resin.

When the molding resin is injected, also the space between the metal plate 3 and the anchoring member 4 is filled with the molding resin. The anchoring member 4 firmly bites the solidified molding resin to prevent the metal plate 3 from separating from the resin package 12.

According to the manufacturing method described above, the anchoring member 4 is fixed to the metal plate 2 by utilizing a step of "trial operation" for confirming positioning accuracy of the bonding wire feeder and the bonding tool. The step of "trial operation" is a step which is inherently needed. Therefore, the manufacturing method described above can be added with the step of fixing the anchoring member 4 without a considerable increase in cost.

Points to keep in mind for the semiconductor device 10 explained in the embodiment will be mentioned. It is preferable to provide a layer of polyamide resin at surroundings of the semiconductor chips (IGBT 5, diode 6) as well as the back faces of the metal plates 2 and 3. The polyamide resin improves bonding performance between the resin package 12 and the metal plate 2 (metal plate 3) similar to Japanese Patent Application Laid-open No. 2003-124406 described above.

Although it is preferable that the anchoring member 4 is made of a material the same as that of the bonding wire 9, the anchoring member 4 may not necessarily be made of the material the same as that of the bonding wire 9.

According to the semiconductor device 10 of the embodiment, the semiconductor chips are molded between two sheets of the metal plates 2 and 3 in the molding resin. The technology disclosed in the present specification is preferably applicable also to a semiconductor device of a mode in which one sheet of a metal plate is attached to one face of a resin package.

Also, in a case where a semiconductor chip is molded between two sheets of metal plates, if the anchoring member is fixed to at least the metal plate on one side of two sheets of the metal plates, the advantage of the novel technology disclosed in the present specification can be enjoyed.

According to the semiconductor device 10 of the embodiment, two pieces of the anchoring members are fixed to the back face of one sheet of the metal plate 2 (metal plate 3). The single anchoring member may be fixed to the back surface of one sheet of the metal plate. Or, three pieces or more of the anchoring members may be fixed to the back face of one sheet of the metal plate.

Although it is preferable that the anchoring member is disposed between the contiguous semiconductor chips, other locations will do.

While specific examples of the present invention have been described above in detail, these examples are merely illustrative and place no limitation on the scope of the claims. The technology described in the claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A semiconductor device, comprising:
    a semiconductor chip;
    a resin package molding the semiconductor chip;
    a metal plate having the semiconductor chip mounted thereon, being, fixed and exposed at a surface of the resin package; and
    an anchoring member bridged between two points on a back surface of the metal plate;
    wherein a space between the metal plate and the anchoring member is filled with a resin of the resin package and the anchoring member being completely covered by the resin.

2. The semiconductor device according to claim 1, further comprising:

a metal wire connecting the semiconductor chip and a terminal within the resin package;
wherein the anchoring member and the metal wire are formed of the same metal material.

3. The semiconductor device according to claim 1, wherein a thermal expansion rate of the anchoring member is lower than a thermal expansion rate of the resin package.

4. The semiconductor device according to claim 1, further comprising:
    another semiconductor chip;
    wherein the two semiconductor chips are molded in the resin package, and
    at least a portion of the anchoring member is positioned between the two semiconductor chips.

5. A method for manufacturing a semiconductor device according to claim 1, the method comprising the step of:
    fixing the anchoring member to the back surface of a metal plate by using a tool for bonding a metal wire connecting the semiconductor chip and a terminal.

6. The method for manufacturing the semiconductor device according to claim 5, the method further comprising the step of:
    connecting the semiconductor chip and the terminal;
    wherein the fixing of the anchoring member to the back surface of the metal plate is conducted before the connecting of the semiconductor chip and the terminal.

7. The semiconductor device according to claim 1, wherein at least a part of a front surface of the metal plate is exposed from the resin package.

8. The semiconductor device according to claim 1, further comprising:
    another metal plate fixed to an opposite surface of the resin package; and
    another anchoring member bridged between two points on a back surface of the other metal plate;
    wherein a space between the other metal plate and the anchoring member is filled with the resin of the resin package.

* * * * *